United States Patent [19]
Liu et al.

[11] Patent Number: 6,035,420
[45] Date of Patent: *Mar. 7, 2000

[54] METHOD OF PERFORMING AN EXTENSIVE DIAGNOSTIC TEST IN CONJUNCTION WITH A BIOS TEST ROUTINE

[75] Inventors: Ji-hwan Liu, Cuperinto; Lowell Starr, San Jose; Wei Wu, Mountain View, all of Calif.

[73] Assignee: Micron Electronics, Inc., Nampa, Id.

[ * ] Notice: This patent is subject to a terminal disclaimer.

[21] Appl. No.: 08/942,463

[22] Filed: Oct. 1, 1997

[51] Int. Cl.$^7$ ...................................... G06F 12/14
[52] U.S. Cl. ............................... 714/25; 714/36; 714/32; 714/34; 714/42; 714/43; 714/44; 714/720; 714/739
[58] Field of Search ................... 714/36, 46, 44, 714/42, 43, 25, 32, 34, 718, 719, 720, 739

[56] References Cited

U.S. PATENT DOCUMENTS

| | | |
|---|---|---|
| 4,057,847 | 11/1977 | Lowell et al. ........................... 364/200 |
| 4,449,182 | 5/1984 | Rubinson et al. . |
| 4,672,535 | 6/1987 | Katzman et al. ....................... 364/200 |
| 4,707,803 | 11/1987 | Anthony, Jr. et al. . |
| 4,769,764 | 9/1988 | Levanon .................................. 364/708 |
| 4,835,737 | 5/1989 | Herrig et al. . |
| 4,949,245 | 8/1990 | Martin et al. . |
| 4,999,787 | 3/1991 | McNally et al. . |
| 5,006,961 | 4/1991 | Monico . |
| 5,033,048 | 7/1991 | Pierce et al. ........................... 714/739 |
| 5,051,720 | 9/1991 | Kittirutsunetorn .................. 340/310 R |
| 5,138,619 | 8/1992 | Fasang et al. .......................... 714/739 |
| 5,157,663 | 10/1992 | Major et al. ............................. 371/9.1 |
| 5,210,855 | 5/1993 | Bartol . |
| 5,245,615 | 9/1993 | Treu ....................................... 371/16.5 |
| 5,253,348 | 10/1993 | Scalise .................................... 395/325 |
| 5,266,838 | 11/1993 | Gerner .................................... 307/19 |
| 5,269,011 | 12/1993 | Yanai et al. . |
| 5,272,584 | 12/1993 | Austruy et al. . |
| 5,307,354 | 4/1994 | Cramer et al. . |
| 5,317,693 | 5/1994 | Cuenod et al. . |
| 5,329,625 | 7/1994 | Kannan et al. . |
| 5,337,413 | 8/1994 | Lui et al. . |
| 5,351,276 | 9/1994 | Doll, Jr. et al. . |
| 5,386,567 | 1/1995 | Lien et al. . |
| 5,388,267 | 2/1995 | Chan et al. .............................. 714/36 |
| 5,404,494 | 4/1995 | Garney . |
| 5,432,946 | 7/1995 | Allard et al. ........................... 395/750 |
| 5,440,748 | 8/1995 | Sekine et al. . |
| 5,463,766 | 10/1995 | Schieve et al. ......................... 714/46 |
| 5,473,499 | 12/1995 | Weir ........................................ 361/58 |
| 5,483,419 | 1/1996 | Kaczeus, Sr. et al. . |
| 5,487,148 | 1/1996 | Komori et al. . |

(List continued on next page.)

FOREIGN PATENT DOCUMENTS 0 866 403 A1  9/1998  European Pat. Off. .

OTHER PUBLICATIONS

Shanley and Anderson, PCI System Architecture, Third Edition, Chapters 15 & 16, pp. 297–328, CR 1995.

PCI Hot–Plug Specification, Preliminary Revision for Review Only, Revision 0.9, pp. i–vi, and 1–25, Mar. 5, 1997.

SES SCSI–3 Enclosure Services, X3T10/Project 1212–D/Rev 8a, pp. i, iii–x, 1–76, and 1–1 (index), Jan. 16, 1997.

Compaq Computer Corporation, Technology Brief, pp. 1–13, Dec. 1996, "Where Do I Plug the Cable? Solving the Logical–Physical Slot Numbering Problem.".

*Primary Examiner*—Robert W. Beausoliel, Jr.
*Assistant Examiner*—Wasseem H. Hamdan
*Attorney, Agent, or Firm*—Knobbe Martens Olson & Bear LLP

[57] ABSTRACT

A BIOS testing routine is initiated. Control is transferred to a diagnostic routine. The diagnostic routine performs a series of test in which a plurality of components are examined. In one embodiment, a random access/random data memory test is performed on a block of memory. Subsequently, control is transferred to the BIOS testing routine.

10 Claims, 4 Drawing Sheets

U.S. PATENT DOCUMENTS

| | | | |
|---|---|---|---|
| 5,491,791 | 2/1996 | Glowny et al. | |
| 5,493,574 | 2/1996 | McKinley | |
| 5,493,666 | 2/1996 | Fitch | |
| 5,517,646 | 5/1996 | Piccirillo et al. | |
| 5,526,289 | 6/1996 | Dinh et al. | 364/557 |
| 5,528,409 | 6/1996 | Cucci et al. | 359/171 |
| 5,546,272 | 8/1996 | Moss et al. | 361/687 |
| 5,555,510 | 9/1996 | Verseput et al. | |
| 5,559,764 | 9/1996 | Chen et al. | 396/30 |
| 5,559,958 | 9/1996 | Farrand et al. | 395/183.03 |
| 5,559,965 | 9/1996 | Oztaskin et al. | |
| 5,564,024 | 10/1996 | Pemberton | |
| 5,568,610 | 10/1996 | Brown | |
| 5,568,619 | 10/1996 | Blackledge et al. | |
| 5,572,403 | 11/1996 | Mills | 361/695 |
| 5,577,205 | 11/1996 | Hwang et al. | |
| 5,579,491 | 11/1996 | Jeffries et al. | |
| 5,581,712 | 12/1996 | Herrman | |
| 5,581,714 | 12/1996 | Amini et al. | |
| 5,588,144 | 12/1996 | Inoue et al. | |
| 5,596,711 | 1/1997 | Burckhartt et al. | 714/36 |
| 5,598,407 | 1/1997 | Bud et al. | 370/330 |
| 5,606,672 | 2/1997 | Wade | |
| 5,608,878 | 3/1997 | Cohen et al. | |
| 5,615,207 | 3/1997 | Gephardt et al. | |
| 5,621,159 | 4/1997 | Brown et al. | 73/9 |
| 5,622,221 | 4/1997 | Genga, Jr. et al. | 165/208 |
| 5,627,962 | 5/1997 | Goodrum et al. | 714/36 |
| 5,632,021 | 5/1997 | Jennings et al. | |
| 5,638,289 | 6/1997 | Yamada et al. | |
| 5,644,470 | 7/1997 | Benedict et al. | |
| 5,644,731 | 7/1997 | Liencres et al. | |
| 5,651,006 | 7/1997 | Fujino et al. | |
| 5,652,832 | 7/1997 | Kane et al. | |
| 5,652,892 | 7/1997 | Ugajin | 395/750 |
| 5,655,081 | 8/1997 | Bonnell et al. | |
| 5,655,148 | 8/1997 | Richman et al. | |
| 5,659,682 | 8/1997 | Devarakonda et al. | |
| 5,664,119 | 9/1997 | Jeffries et al. | |
| 5,666,538 | 9/1997 | DeNicola | |
| 5,671,371 | 9/1997 | Kondo et al. | 395/306 |
| 5,675,723 | 10/1997 | Ekrot et al. | |
| 5,680,288 | 10/1997 | Carey et al. | |
| 5,684,671 | 11/1997 | Hobbs et al. | |
| 5,689,637 | 11/1997 | Johnson et al. | |
| 5,696,899 | 12/1997 | Kalwitz | |
| 5,696,970 | 12/1997 | Sandage et al. | |
| 5,724,529 | 3/1998 | Smith et al. | |
| 5,726,506 | 3/1998 | Wood | |
| 5,737,708 | 4/1998 | Grob et al. | 455/557 |
| 5,740,378 | 4/1998 | Rehl et al. | |
| 5,742,833 | 4/1998 | Dea et al. | 395/750.05 |
| 5,747,889 | 5/1998 | Raynham et al. | |
| 5,748,426 | 5/1998 | Bedingfield et al. | |
| 5,752,164 | 5/1998 | Jones | 455/33.1 |
| 5,754,797 | 5/1998 | Takahashi | |
| 5,761,033 | 6/1998 | Wilhelm | |
| 5,761,045 | 6/1998 | Olson et al. | |
| 5,761,462 | 6/1998 | Neal et al. | |
| 5,764,968 | 6/1998 | Ninomiya | |
| 5,765,008 | 6/1998 | Desai et al. | |
| 5,765,198 | 6/1998 | McCrocklin et al. | |
| 5,768,541 | 6/1998 | Pan-Ratzlaff | |
| 5,768,542 | 6/1998 | Enstrom et al. | |
| 5,774,741 | 6/1998 | Choi | |
| 5,778,197 | 7/1998 | Dunham | 395/284 |
| 5,781,703 | 7/1998 | Desai et al. | |
| 5,781,767 | 7/1998 | Inoue et al. | |
| 5,781,798 | 7/1998 | Beatty et al. | |
| 5,784,576 | 7/1998 | Guthrie et al. | |
| 5,787,459 | 7/1998 | Stallmo et al. | 711/112 |
| 5,790,775 | 8/1998 | Marks et al. | 395/182.07 |
| 5,790,831 | 8/1998 | Lin et al. | |
| 5,793,987 | 8/1998 | Quackenbush et al. | |
| 5,794,035 | 8/1998 | Golub et al. | |
| 5,796,185 | 8/1998 | Takata et al. | |
| 5,796,580 | 8/1998 | Komatsu et al. | 361/687 |
| 5,796,981 | 8/1998 | Abudayyeh et al. | |
| 5,797,023 | 8/1998 | Berman et al. | 714/36 |
| 5,798,828 | 8/1998 | Thomas et al. | |
| 5,799,036 | 8/1998 | Staples | |
| 5,801,921 | 9/1998 | Miller | |
| 5,802,269 | 9/1998 | Poisner et al. | |
| 5,802,305 | 9/1998 | McKaughan et al. | 395/200.57 |
| 5,802,324 | 9/1998 | Wunderlich et al. | 395/281 |
| 5,802,393 | 9/1998 | Begun et al. | |
| 5,802,552 | 9/1998 | Fandrich et al. | |
| 5,802,592 | 9/1998 | Chess et al. | 714/36 |
| 5,803,357 | 9/1998 | Lakin | 236/78 B |
| 5,805,834 | 9/1998 | McKinley et al. | |
| 5,809,224 | 9/1998 | Schultz et al. | |
| 5,812,748 | 9/1998 | Ohran et al. | 395/182.02 |
| 5,812,750 | 9/1998 | Dev et al. | |
| 5,812,757 | 9/1998 | Okamoto et al. | |
| 5,812,858 | 9/1998 | Nookala et al. | |
| 5,815,117 | 9/1998 | Kolanek | |
| 5,815,652 | 9/1998 | Ote et al. | |
| 5,821,596 | 10/1998 | Miu et al. | 257/419 |
| 5,822,547 | 10/1998 | Boesch et al. | |
| 5,835,719 | 11/1998 | Gibson et al. | 395/200.51 |
| 5,835,738 | 11/1998 | Blackledge, Jr. et al. | |
| 5,838,932 | 11/1998 | Alzien | 395/308 |
| 5,841,991 | 11/1998 | Russell | |
| 5,852,720 | 12/1998 | Gready et al. | |
| 5,852,724 | 12/1998 | Glenn, II et al. | 395/200.69 |
| 5,857,074 | 1/1999 | Johnson | |
| 5,864,653 | 1/1999 | Tavallaei et al. | 315/181 |
| 5,875,310 | 2/1999 | Buckland et al. | 395/306 |
| 5,878,238 | 3/1999 | Gan et al. | 395/308 |
| 5,881,311 | 3/1999 | Woods | 395/824 |

METHOD OF PERFORMING AN EXTENSIVE DIAGNOSTIC TEST IN CONJUNCTION WITH A BIOS TEST ROUTINE

BACKGROUND OF THE INVENTION

RELATED APPLICATIONS

The subject matter of U.S. Patent Application entitled "APPARATUS FOR PERFORMING AN EXTENSIVE DIAGNOSTIC TEST IN CONJUNCTION WITH A BIOS TEST ROUTINE", filed on Oct. 1, 1997, application Ser. No. 08/942,163, and having attorney Docket No. MNFRAME.009A is related to this application.

APPPENDICES

Appendix A, which forms a part of this disclosure, is a list of commonly owned co-pending U.S. patent applications. Each one of the applications listed in Appendix A is hereby incorporated herein in its entirety by reference thereto.

COPYRIGHT RIGHTS

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

The invention relates to computers. Specifically, the invention relates to computer diagnostic tests.

DESCRIPTION OF THE RELATED ART

Computers are an integral part of nearly all organizations—from nonprofit charities and small businesses to multinational corporations. Nearly all of these organizations can operate more efficiently if provided an ability to share electronic data files and information among the many people within the organization. In order for an organization to share files, large computers, generally called servers, are used to provide general computing finctions to a set of users. As the usage and dependency on such servers increases, the value of reliability in these servers also increases.

For an organization which has come to rely on computers, a computer "crash" may be very detrimental. For instance, a computer crash can cause the loss of productivity between the last back up and the crash. A crash may also cause the corruption of existing data.

A crash may occur when a portion of a computer which is malfunctioning is accessed by a user. For example, if a block of memory has become defective, the defect may not affect operation until data is written to or read back from the memory locations. Therefore, a memory malfunction may be undetected for some period of time if the damaged memory has not been accessed. Other malfunctions may cause a more immediate and pervasive failure. For example, if a fan which is used to maintain a proper temperature within the housing of a computer fails, as the temperature raises in the housing, several components within the computer may fail at nearly the same time, immediately affecting system operation. As the number of users whose time or data may be lost due to a crash increases, the ability to detect a malfunction before a crash occurs becomes even more beneficial.

A typical modern computer runs a series of self tests when power is initially applied to it. One such test is a basic input/output system (BIOS) test. The BIOS is a software interface to the computer hardware. Generally the BIOS is comprised of the system programs for the basic input and output operations such as access to floppy disks, hard drive disks, interfaces and graphical adapters. The tests performed on the BIOS do not extensively test the system components of the computer. Performing a BIOS test does not ensure that no malfunctioning components are present in the system. Therefore, the BIOS test is not a highly effective means of detecting a latent failure and, thereby, preventing a computer crash.

Therefore, it can be seen that there is a need in the industry for a means and method of providing an extensive diagnostic test of a computer.

SUMMARY OF THE INVENTION

The invention is method of and apparatus for performing a diagnostic test in conjunction with a BIOS test routine. A BIOS testing routine is initiated. Control is transferred to a diagnostic routine. The diagnostic routine performs a series of tests in which a plurality of components are examined. For example, in one embodiment the diagnostic routine tests a central processing unit, a peripheral component, an interconnect system, memory and system power. Subsequently, control is transferred to the BIOS testing routine.

In one embodiment, the diagnostic routine tests memory by creating a temporary table of data from stored pseudo random data. Memory is logically divided by determining a set of address blocks which specify a set of continuous address arrays. For ease of implementation, a total number of address blocks in the set of address blocks may be equal to a total number of entries on the temporary table. Data is written from the temporary table into each address block of the set of address blocks in a pseudo random order according to data from the temporary table. Data stored in the memory under test is compared to data written to the memory under test.

In yet another embodiment the diagnostic test may detect a user interrupt during performance of the diagnostic routine. In response to the user interrupt, a manual diagnostic mode is initiated in which user input may be used to perform further diagnostic tests.

BRIEF DESCRIPTION OF THE DRAWINGS

The features, objectives, and advantages of the invention will become more apparent from the detailed description set forth below when taken in conjunction with the drawings:

FIG. 3 is a representative drawing showing the pseudo random data table used in one embodiment of the memory diagnostic routine; and FIG. 4 is a representative drawing showing the temporary table created for use by one embodiment of the memory diagnostic routine.

DETAILED DESCRIPTION OF THE INVENTION

The invention resides within a general purpose or specific fuiction computer. More specifically, the invention envisions a nonvolatile memory, such as a flash read only memory (ROM), in which is stored a BIOS test routine and an extended diagnostic routine. Under certain conditions, the BIOS test routine is paused and the extended diagnostic routine is run. Upon the completion of the extended diagnostic routine, the BIOS test routine is resumed. The diagnostic routine increases the probability of detecting a computer malfunction before the occurrence of a computer crash.

In one embodiment, the extended diagnostic routine is a separate block of code stored within a common ROM with the BIOS test routine. In another embodiment, the extended diagnostic routine is stored in a hard disk drive. Constructing the extended diagnostic routine within a separate block of code may provide several benefits. For example, existing BIOS test routines are readily available for purchase within the industry. Efficiency in development efforts may be increased if use is made of existing BIOS test routine code. If such use is made, rather than extensively modifying existing BIOS test routine code, a separate newly developed diagnostic routine can be developed. The BIOS test routine code is modified to contain a jump command, call command, procedure call or other commonly known or later developed way to transfer control to the extended diagnostic routine. In addition, standard BIOS test routine structures may not support the ability to define a large block of data which is necessary for the extended memory diagnostic test explained more fully below. A newly developed diagnostic routine may adopt a new memory structure in order to support these tests.

In addition, benefits may also be derived by the inclusion of the BIOS test routine and the diagnostic routine on a single ROM. For example, if the BIOS test routine and the extended diagnostic routine are stored within the same ROM, a transfer of control to the diagnostic routine may be made without the use of I/O, thus, increasing the probability of a successful transfer of control.

Several features may be incorporated into the extended diagnostic routine in order to increase the probability of detecting a failure before a crash occurs. One such feature is to provide an option where the diagnostic routine is to be performed repetitively for an extended period time. For example, the extended diagnostic routine may run continuously overnight to detect an intermittent error. In the example below, such operation may be initialized in manual diagnostic mode.

Figure 1:
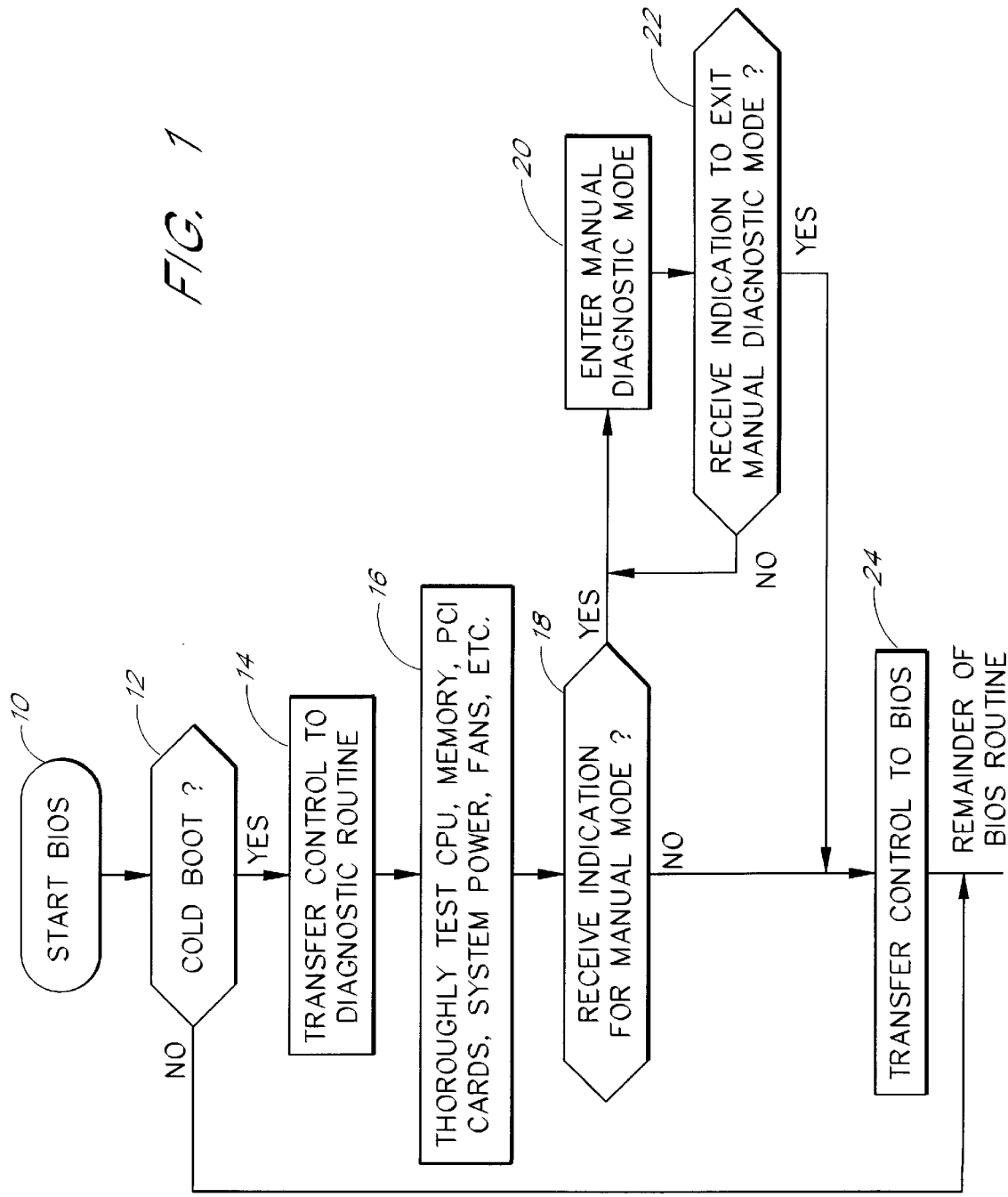
FIG. 1 is a flow chart showing general operation of one embodiment of the invention.

FIG. 1 is a flow chart showing operation of the invention. In block 10, the BIOS test routine begins execution. The basic extended diagnostic routine may take several minutes to execute depending on the size of the computer, the functional units included in the computer and the speed at which the computer operates. Therefore, in the embodiment shown in FIG. 1, the extended diagnostic routine is executed only if the BIOS routine is entered during a "cold boot" of the computer. A cold boot occurs when power is initially applied to the computer or a reset button is pushed. A warm boot occurs in response to a set of key strokes such as depression of the CONTROL-ALT-DELETE keys simultaneously. In alternative embodiments, other conditions may influence the transfer of control to the diagnostic process.

Therefore, within the execution of the BIOS test routine, block 12 determines if the BIOS routine has been entered in response to a cold boot. If a warm boot has occurred, the BIOS continues to operate normally. If a cold boot has occurred, the process flow transfers control to the extended diagnostic routine according to block 14.

Within block 16 the core functions of the diagnostic routine are executed. For example, in one embodiment the diagnostic routine begins by reading to and writing from the central processing unit (CPU). The routine may check several standard CPU registers which record errors. A larger computer may have a plurality of CPU's. The operation of each CPU is tested by the extended diagnostic routine.

In one embodiment, the diagnostic routine also performs a test of the Peripheral Component Interconnect (PCI) cards and buses or other type of local bus components. The testing of these components may be as simple as a series of reads and writes which exercise the functionality of the components and the bus itself. The routine may monitor for error indications detected by the components during this process.

A diagnostic test of the service functions may also be performed. For example, a service processor which controls and/or monitors fan speed, ambient or component temperature and power supply voltage may be consulted to determine whether such functions are operating properly. Additional information concerning control and monitoring of fan speed can be found in co-pending U.S. patent application Ser. No. 09/942,447 filed Oct. 1, 1997, and entitled "Computer Fan Speed Control Device" and in co-pending U.S. patent application Ser. No. 08/942,216 filed Oct. 1, 1997, and entitled "Computer Fan Speed Control Method."

The diagnostic routine may also run an extensive test of memory. In one embodiment, the memory test is a random access/random data routine which is explained fully below.

After completion of the automatic tests, the program may enter a manual test phase. The manual test phase may be entered, for example, by depression of the CONTROL-"d" or other designated key stroke during the diagnostic routine. Block 18 determines if key strokes indicating a desire to enter manual testing mode have been received. If not, the process flow returns control to the BIOS routine as shown by block 24. If the key strokes have been detected, the flow continues to block 20. Within block 20, more extensive diagnostic tests can be run. The user may see a screen which offers him a number of diagnostic options which may include repetition and/or modification of the tests already performed in block 16 above. In one embodiment, the screen may also provide the user with detailed results of the diagnostic tests which are run. The user may use the information to determine the source of a malfunction. When the user has completed the desired diagnostic functions, he may enter a key stroke to inform the diagnostic routine. In block 22, the process flow monitors for such an indication. If the indication is detected, process flow continues in block 24.

One integral part of a computer is memory. Memory is used to store digital information such as software programs, system data and user data. The memory generally has random access memory (RAM) format meaning that data may be written to memory, read back from memory and overwritten with new data. In order for a program to run properly, each bit of the program stored in memory must be accurately written and accessible. In order for user and system data to retain its integrity, each bit of the data stored in memory must be accurately written and accessible. Therefore, the proper operation of computer memory is a major component to the proper operation of a computer.

Modern memory designs strive for maximum density so that as many memory locations as possible may reside in a chip-area that is as small as possible. Efficient designs are achieved through the use of single transistors in conjunction with multiple storage locations. Whenever a single transistor is used in conjunction with two or more storage locations, the probability increases that a write or read to one of the memory locations will affect another one of the memory locations. If the internal memory architecture is known, a custom diagnostic routine can be designed which stresses and monitors for failure modes which are probable given the shared transistor configurations.

Standard memory architectures are repetitious. A basic memory block architecture within a memory unit may be repeated millions of times. The repetitious architectures may lend themselves to patternistic failures. If the internal memory architecture is known, a custom diagnostic routine can be designed which detects patternistic failures.

However, an extensive yet "generic" test of memory is best suited to a general computer environment. In modern systems, the type of memory device used may be unknown or may change during the life of the computer. Therefore, a generic memory test is a more suitable choice than a custom routine. However, a generic patternistic memory diagnostic routine may not detect a patternistic failure because the failure mode pattern may hide within the diagnostic routine pattern. Therefore, benefits may be derived from development of a generic, non-patternistic memory diagnostic routine.

One embodiment of the invention includes a generic memory diagnostic routine. According to a top level view of the invention, a set of data is written into the memory under test. The data is subsequently read out of memory and compared with the value which was originally stored. If the data is the same, the probability that the memory is malfunctioning is low. If the data is not the same, it is highly likely that the memory has malfunctioned.

The memory diagnostic routine incorporated into the invention introduces two pseudo random components in order to avoid being patternistic: pseudo random data and pseudo random access addressing. The data which is stored during the diagnostic process is pseudo random. The order in which the data is written to the memory is also pseudo random. Thus, the process is referred to as a random access/random data process.

In order to introduce pseudo randomness into the routine, embodiments of the invention use a small stored set of pseudo random data. The pseudo random data is a list which has each numerical value between zero and a maximum value stored in a non-sequential order. The stored table is used to create a larger temporary table which is used directly in the random access/random data routine. The larger temporary table is created such that it has each numerical value between zero and a larger maximum value stored in a non-sequential order. Once the larger temporary table has been created, the temporary table data is used to determine the random access and random data of the routine.

During the diagnostic process of some embodiments, a value is written to every memory location under test. Memory may be divided into blocks for testing purposes. The memory may be divided into as many blocks as there are values stored in the larger temporary table. The writing process begins by reading a data value from the temporary table, shifting the data value a number of positions to the left such that the most significant bit of the data is in the most significant bit of the highest valid memory address range. This value becomes the first block address. A series of data, beginning with a first data address of the temporary table is written into a block of memory beginning with the first block address. When the first address block has been filled, a second address block is created in the same manner based on the data stored in a second memory location. The data written into the second address block is different from the data written into the first address block because a new address is chosen from which to start reading the data. In this way, each memory location is written to by the diagnostic process in a pseudo random order with pseudo random data.

Once this process is complete, the data may be read back from memory. Using a similar process to the one described above, the data may be read back from memory and read from the temporary table. The values in each memory location may be compared to the data which was previously written to them. If each value matches, the diagnostic routine may be continued. If any value does not match, the memory has malfunctioned and, in one embodiment, the diagnostic routine may return an error indication to the BIOS routine.

In one embodiment, the process just described is repeated multiple times within the diagnostic routine. Before subsequent memory writes begin, the data in the temporary table is shuffled so that during the next pass, different data is written in a different access pattern to the memory. For example, some data may be swapped with other data. Also, the data may be shifted within the temporary table.

In some cases, a computer may comprise more than one CPU. Each CPU within a computer may have its own bank of memory. The process that is detailed below, assumes operation with just one CPU. If more than one CPU is included in a computer, the routine shown below may be executed in parallel on each CPU, meaning that one or more CPU memory banks are tested simultaneously.

Figure 2A:
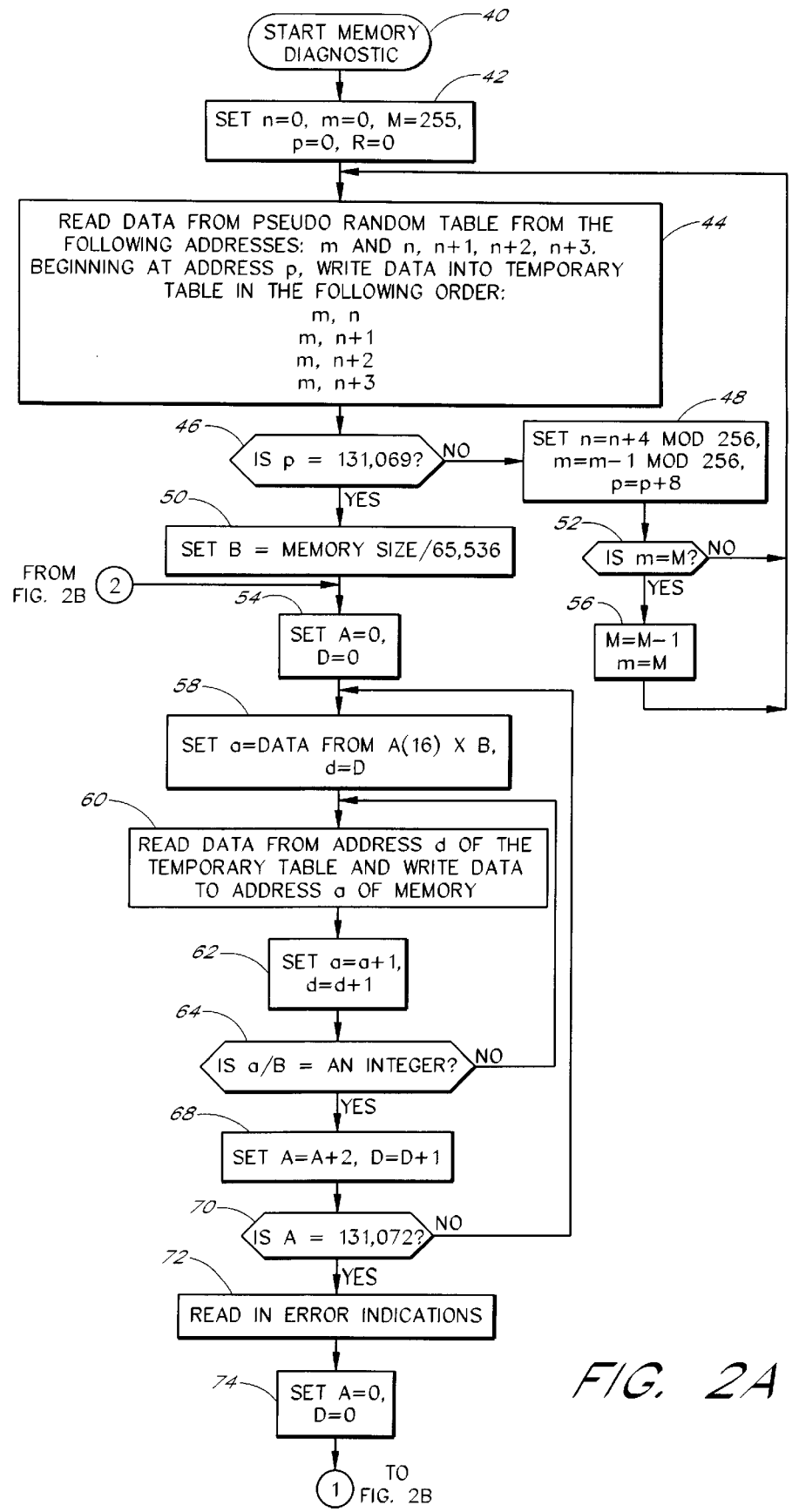
FIGS. 2A and 2B are flow charts showing a specific random access/random data memory diagnostic routine in accordance with one embodiment of the invention.
Figure 2B:
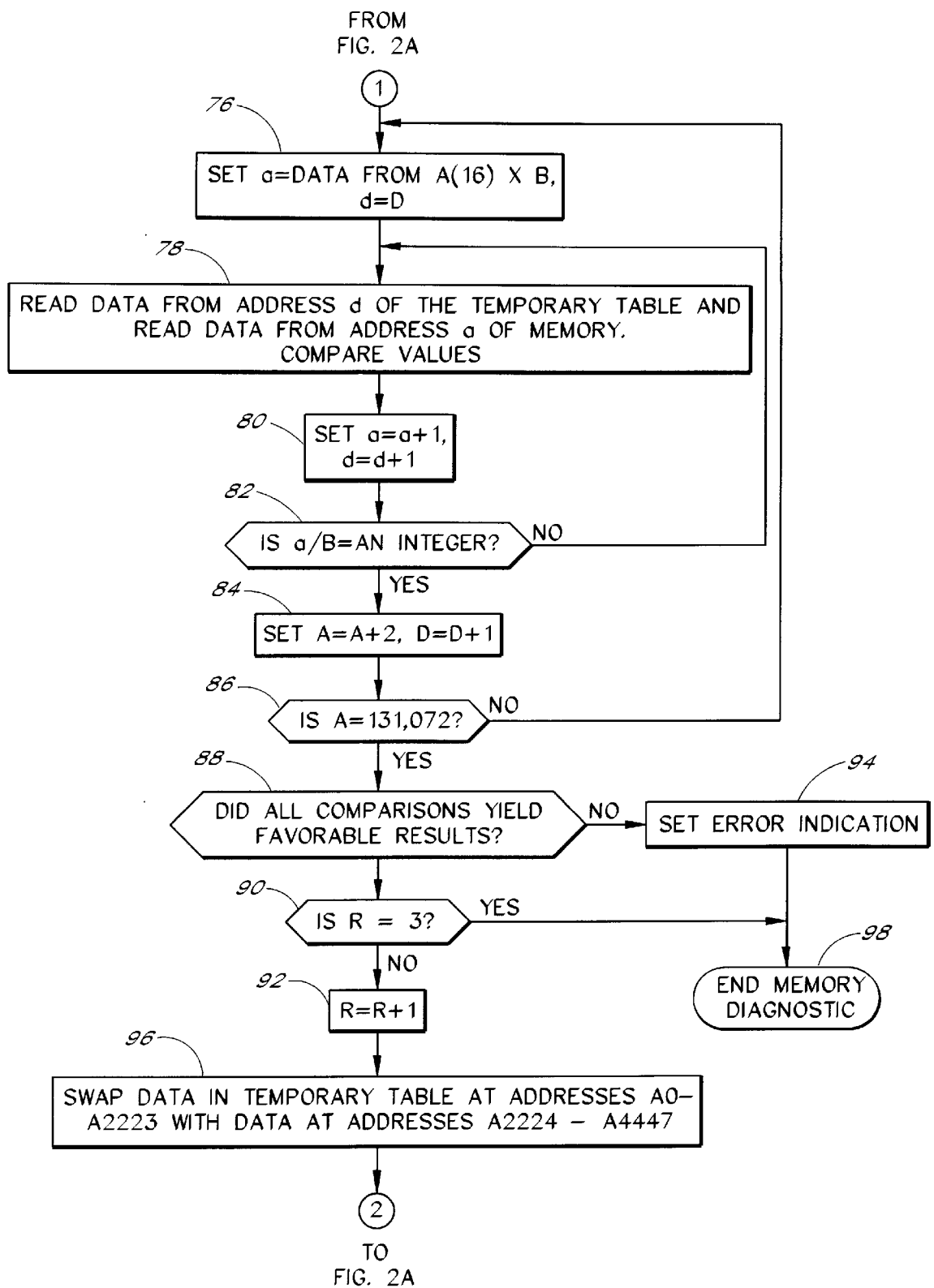

FIGS. 2A and 2B are flow charts illustrating another embodiment invention. The process flow of FIGS. 2A and 2B operates based on the use of 256 bytes of pseudo random data stored in a pseudo random table 100 shown in FIG. 3. The pseudo random table 100 comprises each value from 00H to FFH in a non-sequential, preferably pseudo random, order. The pseudo random table 100 is used by the process flow of FIGS. 2A and 2B to create a larger temporary data table 110 as shown in FIG. 4. The temporary table 110 is capable of storing up to 131,072 bytes of data. In some instances, the data is read out of the temporary table 110 in 8 bit words. In other instances, the data is read out of the temporary table 110 in 16 bit words. Therefore, in FIG. 4, the table is shown in a 16 bit word format with individual addresses for each eight bits of stored data.

The creation of the temporary table from the pseudo random table 100 has several benefits. The diagnostic routine described below seeks to avoid patternistic operation in favor of a more random scheme. To aid in reaching that goal, use is made of a random set of data. As the size of the random data available increases, the amount of randomization of the diagnostic process also increases. However, the size of the flash ROM which, in some embodiments, holds both the BIOS code and the diagnostic code, is limited. Therefore, it is not practical to permanently store large amounts of random data for use by the diagnostic routine.

With particular reference to FIGS. 2A and 2B, process flow begins in start block 40. The first functional block 42 sets a series of variables which are used by the flow process. The variable "n" is the address in the pseudo random table 100 of the eight least significant bits of a newly created 16 bit word. The variable "m" is the address in the pseudo random table 100 of the eight most significant bits of a newly created 16 bit word. The variable "M" is a tracking variable used to step the process flow through the pseudo random table 100. The variable "p" is the address in the temporary table 110 to which the newly created 16 bit word is written. The variable "R" is used to count the number of cycles of the diagnostic process that have been executed. The values of "m" and "M" are set to 255 which sets the write pointer to the last memory location in table 100. All other values are initially set to 0.

In block 44, data is read from the pseudo random table 100 into the temporary table 110. The object of the read process is to fill the temporary table 110 with each possible 16 bit word between 0000H and FFFFH. According to block 44, starting with address p of the temporary table 110, data with the following series of pseudo random table 100 addresses are written into the temporary table 110: m,n, m,n+1, m,n+2, m,n+3. Block 46 determines whether p has reached its final value indicating that the last four memory locations in the temporary table 110 have been filled. If not, the process flow continues to block 48. Block 48 increments "n" by four using modulo 256 addition, decrements "m" by 1 using modulo 256 subtraction, and increments "p" by 8. In block 52, it is determined whether "m" has reached its current terminal value of M indicating that one cycle of the read/write process has been completed. If "m" has not reached its current terminal value, flow continues to block 44 in which another series of read and write operations are executed. In this way, a first pass through the pseudo random table 100 is made while "m" cycles through from FFH to 00H and "n" cycles through four times from 00H to FFH. When "m" returns to its initial value, the response to the inquiry of block 52 is "yes" and flow continues to block 56. In block 56, the tracking variable "M" is reduced by one and "m" is set equal to "M." Again, the read and write operations are executed in block 44 until "m" has again reached its terminal value. In this way, a new set of 256 16-bit words of data are written into the temporary table 110. Process continues in this manner until the temporary table 100 has been filled with 65,536 unique 16 bit words of data.

Once temporary table 110 has been filled with data, the size of the memory to be tested is read in by the diagnostic process. For example, the diagnostic routine may determine the first invalid memory address. The first invalid memory address reflects one memory location higher than the last usable memory address. In this way, the memory address size may be determined. In block 50, the memory size is read in. A variable "B" is used to determine the address block size. In this case, 65,536 16-bit words are available and "B" is set equal to the memory size divided by the number of 16-bit words available, 65,536.

In block 54, several variables are set which are used for the data read/write process. The variable "A" is used to specify the memory location within the temporary table 110 of the data which is used to specify the current block address. The variable "D" is used to specify a memory location within the temporary table 110 of the data which is written into memory.

In block 58, a first address block memory location is set. The variable "a" is set equal to the 16 bit word data stored in location "A" multiplied times the address block size "B". The variable "a" is used to step the address range through the current address block. The variable "d" is set equal to "D". The variable "d" is used to step the data pointer through the temporary table 110 to specify data which is stored in memory.

In block 60, data is read from address "d" of the temporary table 110 and written to location address "a" of the memory which is being tested. In block 62, both data pointer "d" and address pointer "a" are incremented so that upon execution of the next read/write operation, the next 8 bit word in the temporary table 110 is written into the next consecutive address location of the address block under test. Block 64 is used to determine whether the end of the current address block has been reached by inquiring whether the next address "a" is a multiple of the address block size and, therefore, the first address of another address block. If the next address "a" is not the first address of another address block, the cyclical read/write process continues back to block 60. If the end of the address block has been reached, the flow continue to block 68.

In block 68, the variable "A" is incremented by 2 in order to point to the next 16 bit word in the temporary table 110. The variable "D" is incremented so that different data is written into the next address block. Block 70 inquires whether the end of the temporary table 110 has been reached which indicates that each memory location under test has been written to. If not, flow continues back to block 58 where new values of "d" and "a" are set for the new address block.

If each memory location has been written to, flow continues to block 72. In block 72, the extended diagnostic routine checks for any error indications which may have occurred during the memory witting process.

In blocks 74, 76, 78, 80, 82, 84 and 86 the process defined by blocks 54, 58, 60,62, 64, 68, and 70 is essentially repeated. In this case, however, rather than the read/write operation executed in block 60, data is read from both address "d" of the temporary table and address "a" of memory in block 78. Also in block 78, a comparison is made between the data stored at the indicated memory location and the data in the temporary table 110. If an unfavorable comparisons is made, in block 88, the diagnostic process flow is discontinued and an error indication is returned to the BIOS routine. If each of these comparison yields a favorable response, in block 88, process flow continues.

In the embodiment shown in FIGS. 2A and 2B, the basic diagnostic process just described is repeated three times. Therefore, block 90 determines whether the cycle variable "R" is equal to 3. If not, the value of R is incremented in block 92. In block 96, the data in the temporary table 110 is rearranged so that a different sequence of random addresses and a different sequence of random data is written on subsequent diagnostic tests. In block 96 the data in address locations A0 through A2223 are swapped with the data in address locations AA0 through AA2223 where A0 and AA0 are any 16 bit word address value in the temporary table 110. The data in temporary table 110 may also be shifted by a number of 16 bit word addresses. After execution of block 96, the temporary table 110 contains a new pseudo random set of all values from 0000H to FFFFH. The flow continues back to block 54.

After the diagnostic process has been repeated three times, the result of the comparison in block 90 is "yes" and flow continues to block 98. The diagnostic flow is complete and the process continues with the resumption of the BOIS subroutine.

The general principles of the invention have been described with reference to several embodiments in order to illustrate the features of the invention. However, many specific embodiments which do not follow exactly the specific embodiment shown above may fall within the scope of the invention. For example, the size of the pseudo random data table is arbitrary. Likewise, the size of the temporary table is also arbitrary. As noted above, the larger the size of each of these tables, the more randomness which is introduced to the process. The choice of size may be constrained by the operating environment in which the routine is executed.

In the description above, the data written to each address block is different because the address value from which the data values are read is shifted by one at the beginning of each address block. Any number of ways may be used to change the data within the scope of the invention. For example, the data may be read in a reverse order. The address step size may be increased, i.e. the data pointer may be incremented by three address locations rather than one after each memory write. Likewise, the manner in which the data is modified or shuffled at the end of each cycle may be accomplished in a variety of manners consistent with the invention. For example, the data may be modified by reversing the order of the data. The data may be shuffled by swapping consecutive even and odd values within the table. Any manner in which the data is shuffled provides the advantage of changing the random data and random access pattern for the next cycle.

The invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

Appendix A

Incorporation by Reference of Commonly Owned Applications

The following patent applications, commonly owned and filed Oct. 1, 1997, are hereby incorporated herein in their entirety by reference thereto:

| Title | Application No. | Attorney Docket No. |
|---|---|---|
| "System Architecture for Remote Access and Control of Environmental Management" | 08/942,160 | MNFRAME.002A1 |
| "Method of Remote Access and Control of Environmental Management" | 08/942,215 | MNFRAME.002A2 |
| "System for Independent Powering of Diagnostic Processes on a Computer System" | 08/942,410 | MNFRAME.002A3 |
| "Method of Independent Powering of Diagnostic Processes on a Computer System" | 08/942,320 | MNFRAME.002A4 |
| "Diagnostic and Managing Distributed Processor System" | 08/942,402 | MNFRAME.005A1 |
| "Method for Managing a Distributed Processor System" | 08/942,448 | MNFRAME.005A2 |
| "System for Mapping Environmental Resources to Memory for Program Access" | 08/942,222 | MNFRAME.005A3 |
| "Method for Mapping Environmental Resources to Memory for Program Access" | 08/942,214 | MNFRAME.005A4 |
| "Hot Add of Devices Software Architecture" | 08/942,309 | MNFRAME.006A1 |
| "Method for The Hot Add of Devices" | 08/942,306 | MNFRAME.006A2 |
| "Hot Swap of Devices Software Architecture" | 08/942,311 | MNFRAME.006A3 |
| "Method for The Hot Swap of Devices" | 08/942,457 | MNFRAME.006A4 |
| "Method for the Hot Add of a Network Adapter on a System Including a Dynamically Loaded Adapter Driver" | 08/943,072 | MNFRAME.006A5 |
| "Method for the Hot Add of a Mass Storage Adapter on a System Including a Statically Loaded Adapter Driver" | 08/942,069 | MNFRAME.006A6 |
| "Method for the Hot Add of a Network Adapter on a System Including a Statically Loaded Adapter Driver" | 08/942,465 | MNFRAME.006A7 |
| "Method for the Hot Add of a Mass Storage Adapter on a System Including a Dynamically Loaded Adapter Driver" | 08/962,963 | MNFRAME.006A8 |
| "Method for the Hot Swap of a Network Adapter on a System Including a Dynamically Loaded Adapter Driver" | 08/943,078 | MNFRAME.006A9 |
| "Method for the Hot Swap of a Mass Storage Adapter on a System Including a Statically Loaded Adapter Driver" | 08/942,336 | MNFRAME.006A10 |
| "Method for the Hot Swap of a Network Adapter on a System Including a Statically Loaded Adapter Driver" | 08/942,459 | MNFRAME.006A11 |
| "Method for the Hot Swap of a Mass Storage Adapter on a System Including a Dynamically Loaded Adapter Driver" | 08/942,458 | MNFRAME.006A12 |
| "Apparatus for Performing an Extensive Diagnostic Test in Conjunction with a BIOS Test Routine" | 08/942,163 | MNFRAME.009A |
| "Configuration Management Method for Hot Adding and Hot Replacing Devices" | 08/941,268 | MNFRAME.010A |
| "Configuration Management System for Hot Adding and Hot Replacing Devices" | 08/942,408 | MNFRMME.011A |

-continued

| Title | Application No. | Attorney Docket No. |
|---|---|---|
| "Apparatus for Interfacing Buses" | 08/942,382 | MNFRAME.012A |
| "Method for Interfacing Buses" | 08/942,413 | MNFRAME.013A |
| "Computer Fan Speed Control Device" | 08/942,447 | MNFRAME.016A |
| "Computer Fan Speed Control Method" | 08/942,216 | MNFRAME.017A |
| "System for Powering Up and Powering Down a Server" | 08/943,076 | MNFRAME.018A |
| "Method of Powering Up and Powering Down a Server" | 08/943,077 | MNFRAME.019A |
| "System for Resetting a Server" | 08/942,333 | MNFRAME.020A |
| "Method of Resetting a Server" | 08/942,405 | MNFRAME.021A |
| "System for Displaying Flight Recorder" | 08/942,070 | MNFRAME.022A |
| "Method of Displaying Flight Recorder" | 08/942,068 | MNFRAME.023A |
| "Synchronous Communication Interface" | 08/943,355 | MNFRAME.024A |
| "Synchronous Communication Emulation" | 08/942,004 | MNFRAME.025A |
| "Software System Facilitating the Replacement or Insertion of Devices in a Computer System" | 08/942,317 | MNFRAME.026A |
| "Method for Facilitating the Replacement or Insertion of Devices in a Computer System" | 08/942,316 | MNFRAME.027A |
| "System Management Graphical User Interface" | 08/943,357 | MNFRAME.028A |
| "Display of System Information" | 08/942,195 | MNFRAME.029A |
| "Data Management System Supporting Hot Plug Operations on a Computer" | 08/942,129 | MNFRAME.030A |
| "Data Management Method Supporting Hot Plug Operations on a Computer" | 08/942,124 | MNFRAME.031A |
| "Alert Configurator and Manager" | 08/942,005 | MNFRAME.032A |
| "Managing Computer System Alerts" | 08/943,356 | MNFRAME.033A |
| "Computer Fan Speed Control System" | 08/940,301 | MNFRAME.034A |
| "Computer Fan Speed Control System Method" | 08/941,267 | MNFRAME.035A |
| "Black Box Recorder for Information System Events" | 08/942,381 | MNFRAME.036A |
| "Method of Recording Information System Events" | 08/942,164 | MNFRAME.037A |
| "Method for Automatically Reporting a System Failure in a Server" | 08/942,168 | MNFRAME.040A |
| "System for Automatically Reporting a System Failure in a Server" | 08/942,384 | MNFRAME.041A |
| "Expansion of PCI Bus Loading Capacity" | 08/942,404 | MNFRAME.042A |
| "Method for Expanding PCI Bus Loading Capacity" | 08/942,223 | MNFRAME.043A |
| "System for Displaying System Status" | 08/942,347 | MNFRAME.044A |
| "Method of Displaying System Status" | 08/942,071 | MNFRAME.045A |
| "Fault Tolerant Computer System" | 08/942,194 | MNFRAME.046A |
| "Method for Hot Swapping of Network Components" | 08/943,044 | MNFRAME.047A |
| "A Method for Communicating a Software Generated Pulse Waveform Between Two Servers in a Network" | 08/942,221 | MNFRAME.048A |
| "A System for Communicating a Software Generated Pulse Waveform Between Two Servers in a Network" | 08/942,409 | MNFRAME.049A |
| "Method for Clustering Software Applications" | 08/942,318 | MNFRAME.050A |
| "System for Clustering Software Applications" | 08/942,411 | MNFRAME.051A |
| "Method for Automatically Configuring a Server after Hot Add of a Device" | 08/942,319 | MNFRAME.052A |
| "System for Automatically Configuring a Server after Hot Add of a Device" | 08/942,331 | MNFRAME.053A |
| "Method of Automatically Configuring and Formatting a Computer System and Installing Software" | 08/942,412 | MNFRAME.054A |
| "System for Automatically Configuring and Formatting a Computer System and Installing Software" | 08/941,955 | MNFRAME.055A |
| "Determining Slot Numbers in a Computer" | 08/942,462 | MNFRAME.056A |
| "System for Detecting Errors in a Network" | 08/942,169 | MNFRAME.058A |
| "Method of Detecting Errors in a Network" | 08/940,302 | MNFRAME.059A |
| "System for Detecting Network Errors" | 08/942,407 | MNFRAME.060A |
| "Method of Detecting Network Errors" | 08/942,573 | MNFRAME.061A |

What is claimed is:

1. The method of testing a computer comprising:

initiating a BIOS testing routine;

transferring control to a diagnostic test routine in the normal course of BIOS testing;

performing said diagnostic test routine in which a plurality of components are examined, said diagostic test routine comprising creating a temporary table of data from a smaller table of stored pseudo random data, wherein said temporary table is larger than said smaller table of stored pseudo random data, determining a set of address blocks by logically dividing a memory under test into a set of continuous address arrays, wherein a total number of address blocks in said set of address blocks is equal to a total number of entries on said tempory table, writing data from said temporary table into each address block of said set of address blocks in a pseudo random order according to data from said temporary table, and comparing data stored in said memory under test to data written to said memory under test; and resuming said BIOS testing routine.

2. The method of claim 1 wherein performing said diagnostic test routine comprises testing a central processing unit, a peripheral component, an interconnect system, memory and system power.

3. The method of claim 1 further comprising:

detecting a user interrupt during performance of said diagnostic test routine; and initiating a manual diagnostic mode wherein user input is used to perform further diagnostic tests.

4. The method of claim 1 wherein said diagnostic test routine is performed if said BIOS testing routine is in itiated from a cold boot.

5. The method of claim 1 further comprising:

re-initiating said BIOS testing routine in response to a warm boot; and bypassing performance of said diagnostic test routine.

6. A method of testing computer memory comprising:

creating a temporary table of data from a smaller table of stored pseudo random data, wherein said temporary table is larger than said smaller table of stored pseudo random data;

determining a set of address blocks by logically dividing memory under test into a set of continuous address arrays, wherein a total number of address blocks in said set of address blocks is equal to a total number of entries on said temporary table;

writing data from said temporary table into each address block of said set of address blocks in a pseudo random order according to data from said temporary table; and comparing data stored in said memory under test to data written to said memory under test.

7. The method of claim 6 wherein each entry in said smaller table of stored pseudo random data comprises a first number of digits and wherein said smaller table of stored pseudo random data comprises one entry for each possible value of said first number of digits and where in said creating of s aid temporary table further comprises determining a set of temporary table entries having a second number of digits wherein said second number of digits is equal to twice said first number of digits.

8. The method of claim 7 wherein said step of determining said set of temporary value entries further comprises sequentially attaching each entry in said smaller table of stored pseudo random data as a set of most significant bits with each entry in said smaller table of stored pseudo random data as a set of least significant bits such that said temporary table comprises an entry for each possible value of said second number of digits.

9. The method of claim 8 wherein said writing data from said temporary table comprises:

determining a block address size equal to a total number of memory addresses under test divided by a number of entries in said temporary table;

reading a first entry from said temporary table;

determining a first block address by multiplying said first entry times said block address size; and writing a series of data from said temporary table to a set of consecutive addresses beginning with said first block address.

10. The method of claim 9 further comprising:

reading a second entry from said temporary table;

determining second block address by multiplying said second entry times said block address size; and writing a second series of data from said temporary table to a set of consecutive addresses beginning with said second block address.

* * * * *

UNITED STATES PATENT AND TRADEMARK OFFICE
CERTIFICATE OF CORRECTION

PATENT NO. : 6,035,420
DATED : March 7, 2000
INVENTOR(S) : Liu et al.

Page 1 of 1

It is certified that error appears in the above-identified patent and that said Letters Patent is hereby corrected as shown below:

Column 1, line 43, please remove "finctions" and replace therefore with --functions--.

Column 2, line 67, please remove "finction" and replace therefore with --function--.

Column 13, line 36, please remove "is in itiated" and replace therefore with --is initiated--.

Column 14, line 15, please remove "of s aid" and replace there with --of said--.

Signed and Sealed this

Fifth Day of June, 2001

*Attest:*

*Attesting Officer*

NICHOLAS P. GODICI
*Acting Director of the United States Patent and Trademark Office*